United States Patent

Furusawa et al.

[11] Patent Number: 5,819,410
[45] Date of Patent: Oct. 13, 1998

[54] METHOD FOR MANUFACTURING A PIN AND PIPE ASSEMBLY FOR A BARE CHIP TESTING SOCKET

[75] Inventors: Keisuke Furusawa, Yokohama; Takao Orimo, Machiday, both of Japan

[73] Assignee: The Furukawa Electric Co., Ltd., Toyko, Japan

[21] Appl. No.: 563,582

[22] Filed: Nov. 28, 1995

Related U.S. Application Data

[62] Division of Ser. No. 339,353, Nov. 14, 1994, abandoned.

[30] Foreign Application Priority Data

Dec. 3, 1993 [JP] Japan ................................. 5-339299

[51] Int. Cl.⁶ ................................................ H01K 43/16
[52] U.S. Cl. ............................ 29/883; 29/876; 324/755
[58] Field of Search ............................ 29/876, 883, 889, 29/841; 324/755

[56] References Cited

U.S. PATENT DOCUMENTS

| | | | |
|---|---|---|---|
| 4,038,599 | 7/1977 | Bove et al. | 324/754 |
| 5,015,946 | 5/1991 | Janko | 324/72.5 |
| 5,174,519 | 5/1754 | Collins et al. | 324/754 |
| 5,175,496 | 12/1992 | Collins et al. | |
| 5,347,215 | 9/1994 | Armstrong et al. | 324/761 |
| 5,399,982 | 3/1995 | Driller et al. | 324/755 |

FOREIGN PATENT DOCUMENTS

| | | |
|---|---|---|
| 600604 | 6/1994 | European Pat. Off. |
| 60-14474 | 4/1985 | Japan |
| 3-35779 | 5/1991 | Japan |

*Primary Examiner*—Carl J. Arbes
*Attorney, Agent, or Firm*—Frishauf, Holtz, Goodman, Langer & Chick

[57] ABSTRACT

A bare chip testing socket is provided which includes a base plate having electrodes formed thereon to have the same pattern as a semiconductor chip having a large number of electrodes; a pin assembly, arranged between the semiconductor chip and the base plate, having a large number of testing pins for respectively connecting the electrodes of the semiconductor chip to the electrodes of the base plate; and pressing means for pressing the semiconductor chip to press the electrodes of the semiconductor chip against the test pins of the pin assembly; and methods for manufacturing a pin assembly and pipe assembly constructing the bare chip testing socket are provided. The large number of test pins of the pin assembly are fixed on an insulating member whose outer periphery is surrounded by a frame member, each of the test pins penetrates the insulating member in a thickness direction thereof with both end portions of each test pin exposed from the insulating member by a preset length, and the pipe assembly for guiding the test pins to the respective electrodes of the semiconductor chip is arranged between the semiconductor chip and the pin assembly.

5 Claims, 5 Drawing Sheets

METHOD FOR MANUFACTURING A PIN AND PIPE ASSEMBLY FOR A BARE CHIP TESTING SOCKET

This is a division of application Ser. No. 08/339,353 filed Nov. 14, 1994, now abandoned.

BACKGROUND OF THE INVENTION

1. Field of the Invention

This invention relates to a bare chip testing socket used when the electrical characteristic of a semiconductor chip is tested by pressing test pins onto the electrodes of the semiconductor chip, and a method for manufacturing a pin assembly and pipe assembly constructing the socket.

2. Prior Art

A semiconductor chip is connected to a printed circuit board and packaged in resin or the like, but in the stage of a bare chip which is the preceding stage, the electrical characteristic thereof is tested and a defective chip is removed. The electrical characteristic of the bare chip is tested by applying a voltage which is higher than a normal operating voltage by 10% or more at temperatures of 75 to 100° C. (burn-in). At this time, a bare chip testing socket is used.

The socket includes a pin assembly which has a plurality of test pins arranged and fixed on a sheet of an insulation plate in the same pattern as that of a plurality of electrodes of the semiconductor chip, and the test is made by simultaneously pressing one-side ends of the test pins onto the respective electrodes of the semiconductor chip. The electrode of the semiconductor chip is formed of aluminum, and since the aluminum electrode is covered with a thin oxide layer, it is necessary to press the test pin onto the aluminum electrode with a pressure higher than a preset pressure.

As the pin assembly, a pin assembly having test pins 4 exposed only at the front end faces from an insulating member 1 as shown in FIG. 6A (Examined Japanese Patent Publication (KOKOKU) No. 3-35779) and a pin assembly having test pins 4 whose front end portions are projected and exposed from a plate-like insulating member 3 as shown in FIG. 6B (Examined Japanese Patent Publication (KOKOKU) No. 60-14474) are used.

In the former case, since a large pressing force is required in order to press the entire portion of the insulating member 1 when the front ends of the test pins 4 are pressed against electrodes (not shown) formed on the surface of the semiconductor chip 2, the front end faces of the test pins 4 may be pressed into the insulating member 1 to cause a poor contact.

In the latter case, as shown in the drawing, since the test pins 4 are partially held at the central portions thereof by the plate-like insulating member 3, the pressing force on the electrodes becomes unstable. Since the front ends of the test pins 4 are pressed against the electrodes of the semiconductor chip 2 by pressing the central portions thereof, the front ends of the pins 4 are sometimes separated from the corresponding electrodes of the semiconductor chip 2 when the exposed test pins 4 are bent by application of an excessively large pressing force.

SUMMARY OF THE INVENTION

An object of this invention is to provide a bare chip testing socket capable of permitting a test for the electrical characteristic of a semiconductor chip to be efficiently effected with a high reliability, and a method for manufacturing a pin assembly and pipe assembly constructing the socket.

Another object of this invention is to provide a bare chip testing socket which permits test pins to be pressed onto the electrodes of a semiconductor chip without an extremely large pressing force being applied and which prevents poor contact between the test pins and the electrodes of the semiconductor chip, and a method for manufacturing a pin assembly and pipe assembly constructing the socket.

Still another object of this invention is to provide a bare chip testing socket capable of permitting a pressing force between the test pins and the electrodes of a semiconductor chip to be made stable and permitting the test pins to be less bent and to be stably pressed against the corresponding electrodes of the semiconductor chip, and a method for manufacturing a pin assembly and pipe assembly constructing the socket.

In order to attain the above object, in this invention, a bare chip testing socket includes a base plate on which electrodes having the same pattern as a semiconductor chip having a large number of electrodes are formed; a pin assembly, arranged between the semiconductor chip and the base plate, having a large number of testing pins for respectively connecting the electrodes of the semiconductor chip to the electrodes of the base plate; and pressing means for pressing the semiconductor chip to press the electrodes of the semiconductor chip against the test pins of the pin assembly; wherein the large number of test pins of the pin assembly are fixed on an insulating member whose outer periphery is surrounded by a frame member, each of the test pins penetrates the insulating member in a thickness direction thereof with both end portions of each test pin exposed from the insulating member by a preset length, and a pipe assembly for guiding the test pins to the respective electrodes of the semiconductor chip is arranged between the semiconductor chip and the pin assembly.

Therefore, in the socket of this invention, since the large number of test pins of the pin assembly penetrate the insulating member in the thickness direction thereof and are fixed in the insulating member and the front end portions of the test pins are exposed from the insulating member by a preset length with the insulating member placed on the base portion side of the large number of test pins, the test pins will not be buried in the insulating member and the front end portions of the test pins can be set in contact with the electrodes of the semiconductor chip with an adequate contact pressure. Further, since the front end portions of the large number of exposed test pins are inserted into the respective pipes of the pipe assembly, the test pins can be prevented from being deviated, thereby preventing the front end portions thereof from being separated from the corresponding electrodes of the semiconductor chip.

Preferably, the pipe assembly includes an insulating member, a frame member surrounding the outer periphery of the insulating member and a large number of pipes which penetrate the insulating member and are fixed in the insulating member, and one-side end portions of the test pins are inserted into the corresponding pipes with the front end portions thereof projected from the pipes.

The bare chip testing socket of this invention guides the front end faces of the test pins so as not to be separated from the electrodes of the semiconductor chip and suppresses the bending of the test pins inside the pipes by inserting the test pins of the pin assembly into the pipes of the pipe assembly, thereby increasing a pressing force for pressing the test pins against the electrodes of the semiconductor chip.

Preferably, the insulating members of both of the assemblies utilize a desired insulating material such as silicone rubber or high polymer elastomer. Particularly, for the insulating member of the pin assembly, it is preferable to use an insulating material in which a linear relation can be obtained between the dissolving amount (removing amount) by use of solvent and elapse time and the removing amount can be precisely controlled according to elapse time, for example, silicone rubber which has the above dissolving relation with respect to 2-methoxyethanol series solvent.

Preferably, the large number of test pins of the pin assembly utilize a metal material which has an electrically conductive characteristic and is relatively resilient. Specifically, phosphor bronze, Cu-Be alloy, Ni-Ti alloy, nickel silver, and Corson alloy can be adequately used. The test pin can be freely formed of a line with circular or square cross section or the like.

Further, in the pin assembly and pipe assembly, high strength iron materials, for example, tool steels such as carbon tool steels or alloy tool steels are preferably used as the frame members. Both of the assemblies can be made with high precision by using such a frame member.

The pipe of the pipe assembly may be formed of a desired metal material which is excellent in the workability such as cupronickel, pure copper or stainless steel. The inner diameter and length of the pipe may be variously determined according to the material and shape of the test pin used, but if the exposed portion of the test pin is long, the exposed portion of the test pin is bent, thereby making it impossible to attain a sufficiently large pressing force.

Further, in order to attain the above object, a method for manufacturing a pin assembly constructing a bare chip testing socket of this invention comprises a step of arranging a large number of conductor wires at a preset pitch in a cylindrical member in parallel to the axis of the cylindrical member and forming a pin composite body by injecting an insulating material into the cylindrical member and solidifying the same; a step of cutting the pin composite body with a preset thickness along a surface perpendicular to the large number of conductor wires to form a pin composite chip in which the outer peripheral portion of the insulating material is surrounded by a frame member; a step of removing a portion of the frame member on one end face side of the pin composite chip by a preset length from the pin composite chip; and a step of removing the insulating material by a preset length from both end faces of the pin composite chip.

Further, in order to attain the above object, a method for manufacturing a pipe assembly constructing a bare chip testing socket of this invention comprises a step of arranging a large number of lengthy pipes which permit insertion of conductor wires therein at a preset pitch in a cylindrical member in parallel to the axis of the cylindrical member; a step of injecting an insulating material into the cylindrical member and solidifying the same to form a pipe composite body; and a step of cutting the pipe composite body with a preset thickness along a surface perpendicular to the large number of pipes.

Accordingly, in the manufacturing methods described above, since a large number of conductor wires or a large number of pipes into which conductor wires can be inserted are arranged at a preset pitch in the cylindrical member and fixed by use of the insulating material, the pin assembly and pipe assembly can be efficiently manufactured with high dimensional precision. Therefore, in the bare chip testing socket using the above assemblies, it becomes possible to connect the electrodes of the semiconductor chip to the electrodes of the base plate with high precision.

In the bare chip testing socket of this invention, since the test pins of the pin assembly set in contact with the electrodes of the semiconductor chip are exposed from the insulating material by a sufficiently large length, the front end portions of the test pins will not be buried in the insulating material and an adequate pressing force can be attained between the test pins and the electrodes.

Further, since one-side extending end portions of the test pins are inserted into the pipes of the pipe assembly, separation of the test pins from the corresponding electrodes can be prevented. Therefore, the bare chip testing socket can be used for testing with high reliability over a long period of time.

In addition, since each of the pin assembly and pipe assembly constructing the socket is formed as a composite body constructed by injecting an insulating material into the cylindrical member in which a large number of conductor wires (test pins) or pipes are arranged in parallel at a preset pitch and solidifying the same and cutting the composite body to a preset length, the productivity is high and the dimensional precision of the assembly is high.

The above-described and other objects, features and advantages of this invention will be more clearly understood from the following description based on the accompanying drawings.

DETAILED DESCRIPTION OF THE PREFERRED EMBODIMENTS

There will now be concretely described an embodiment of a bare chip testing socket used for a burn-in test for a bare chip as a bare chip testing socket of this invention and a method for manufacturing a pin assembly and pipe assembly constructing the bare chip testing socket with reference to FIGS. 1 to 5.

Figure 1:
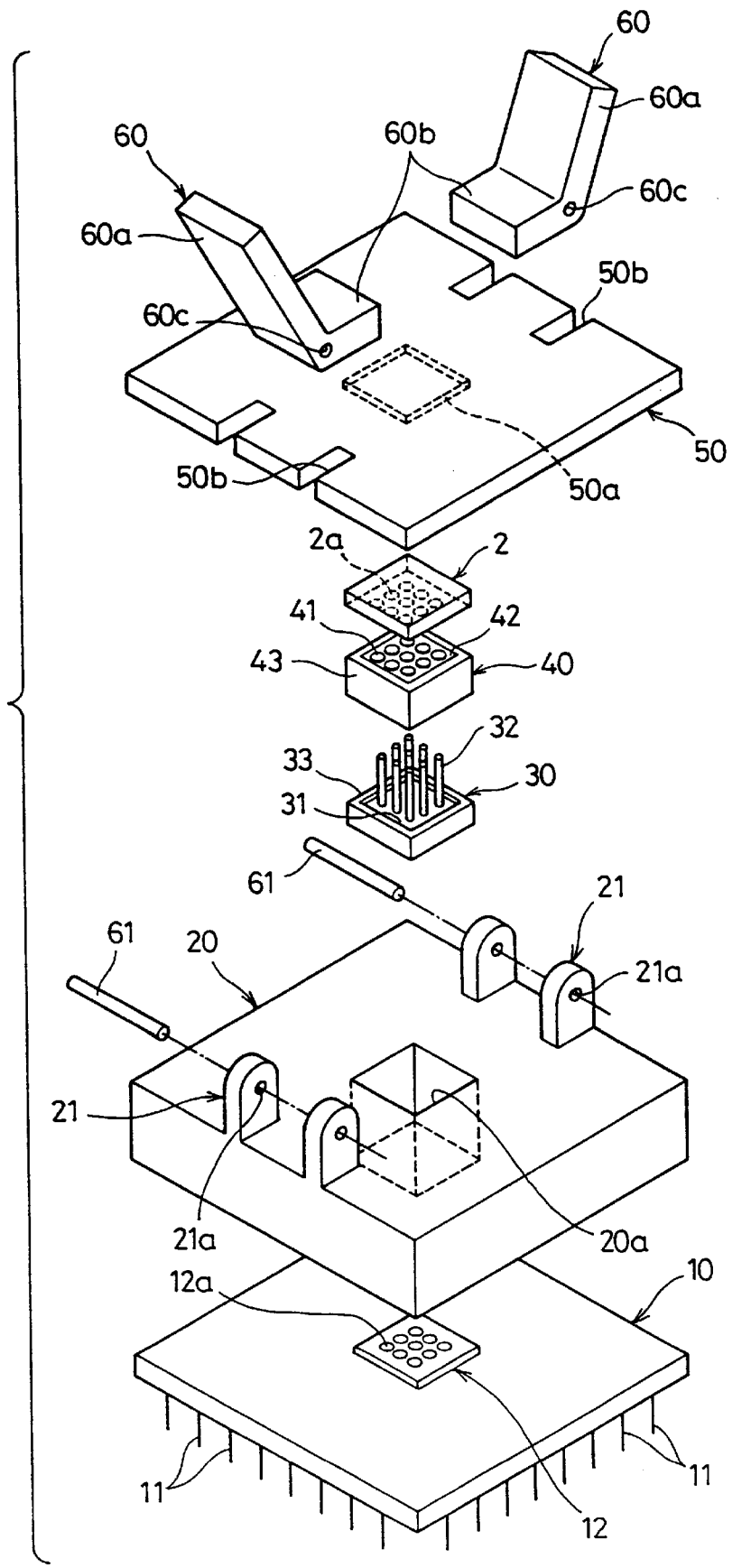
FIG. 1 is an exploded perspective view of a bare chip testing socket of this invention.
Figure 2A:
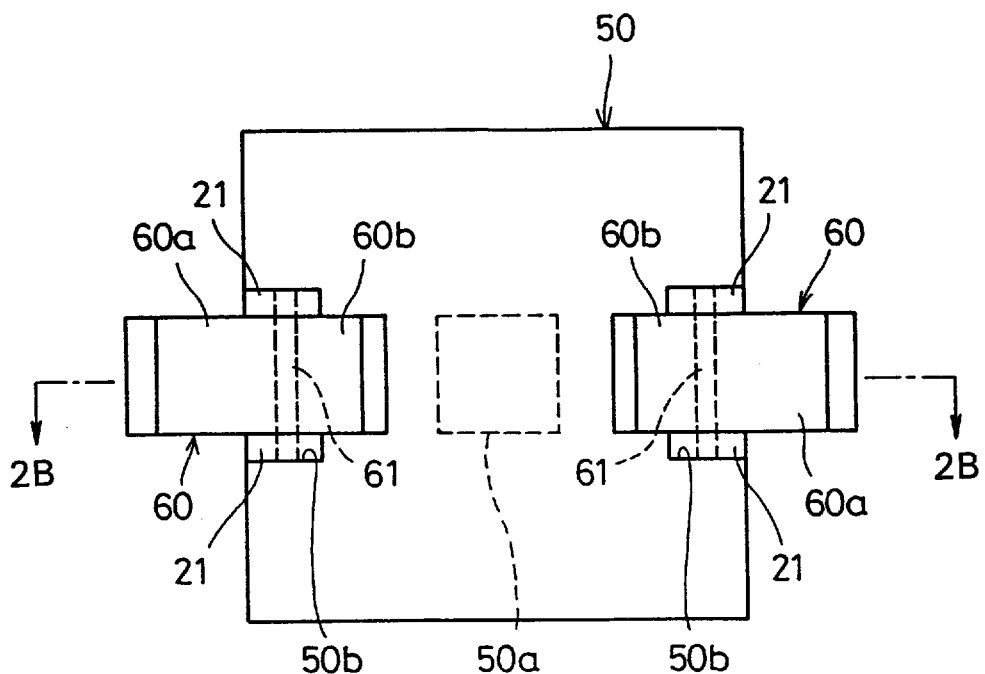
FIG. 2A is a plan view of the socket shown in FIG. 1
Figure 2B:
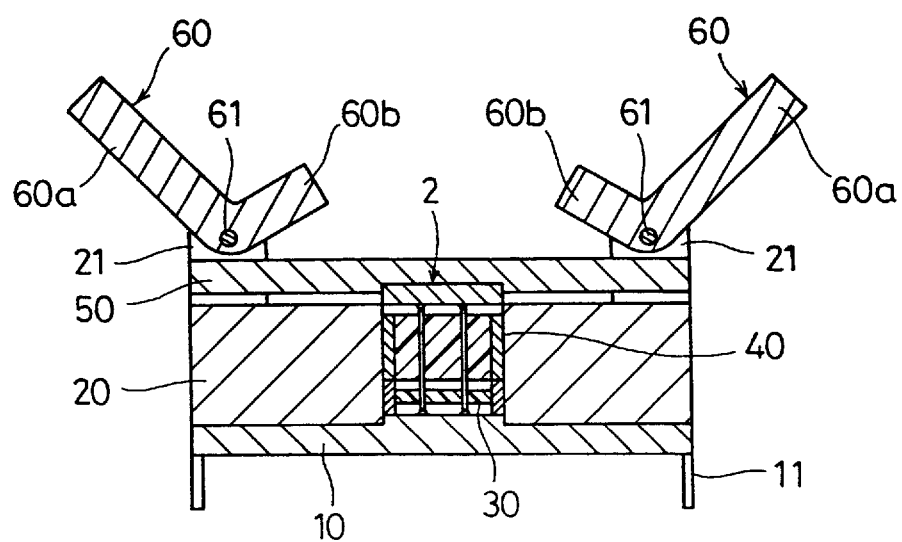
FIG. 2B is a cross sectional view taken along the line 2B—2B thereof.

FIG. 1 is an exploded perspective view of a bare chip testing socket (which is hereinafter simply referred to as a socket). FIGS. 2A and 2B are a plan view of the socket and a cross sectional view taken along the line 2B—2B thereof.

As shown in FIG. 1, the socket of this invention includes a base plate 10, positioning holder 20, pin assembly 30, pipe assembly 40, pressure lid 50 and two levers 60.

The base plate 10 has a large number of lead terminals 11 formed on the undersurface thereof and an electrode forming portion 12 formed to project from the upper surface thereof. Each lead terminal 11 is connected to a tester (not shown) and the electrode forming portion 12 has a large number of electrodes 12a formed on the upper surface thereof. The electrodes 12a are formed of the same number and in the same pattern as electrodes 2a of aluminum of a semiconductor chip 2 and respectively connected to the lead terminals 11.

Figure 3:
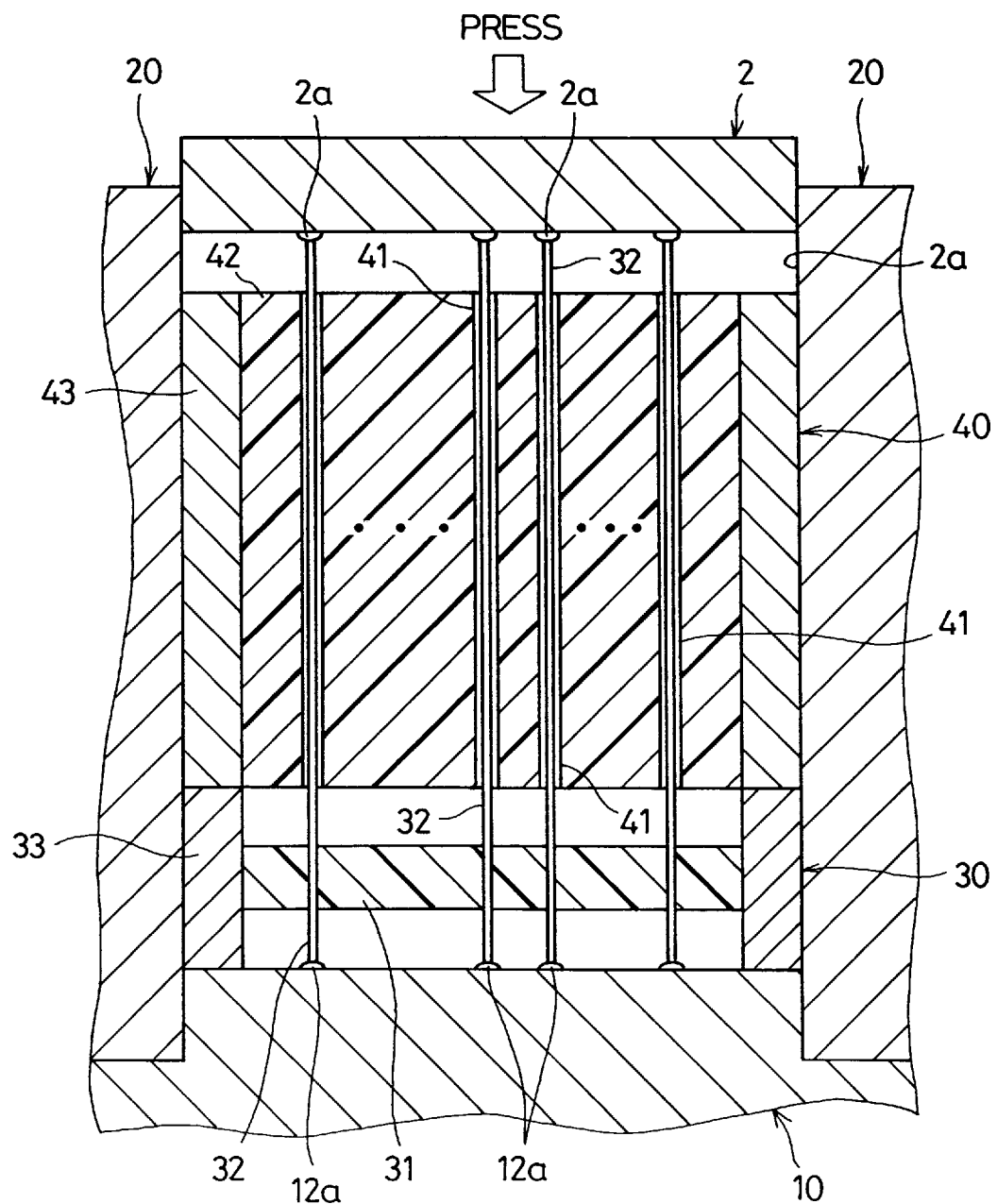
FIG. 3 is an enlarged view of a pin assembly portion of the socket shown in FIG. 1.

The positioning holder 20 has a hollow portion 20a formed in the central portion thereof penetrating in the thickness direction thereof and four supporting portions 21 having insertion holes 21a formed therein and formed in four positions of the upper surface of the positioning holder 20 on both sides of the hollow portion 20a. The guide 20 determines the positions of the electrode forming portion 12, pin assembly 30 and pipe assembly 40 by use of the hollow portion 20a. Therefore, in the positioning holder 20, metal frame members 33, 43 of the pin assembly 30 and pipe assembly 40 are fitted into the hollow portion 20a with the upper and lower end faces thereof set to face each each other as shown in FIG. 3.

The pin assembly 30 includes an insulating plate 31, a large number of test pins 32 and metal frame member 33. The insulating plate 31 is formed by use of a desired insulating material such as silicone rubber or high polymer elastomer. The test pins 32 are formed of the same number and in the same pattern as the electrodes 2a of the semiconductor chip 2 and the base side portions thereof are fixed on the insulating plate 31. As shown in FIGS. 1 and 3, the test pins 32 penetrate the insulating plate 31 in the thickness direction with the upper portions thereof exposed by a length larger than the lower portions thereof. The lower end portions of the test pins 32 are soldered on the corresponding electrodes 12a of the base plate 10. The pin assembly 30 is arranged between the base plate 10 and the semiconductor chip 2 to be tested so as to connect the electrodes 12a to the corresponding electrodes 2a. The metal frame member 33 is formed to surround the outer periphery of the insulating plate 31 as shown in FIG. 3.

The pipe assembly 40 is an insulative guide for guiding the test pins 32 of the pin assembly 30 to the corresponding electrodes 2a of the semiconductor chip 2. The pipe assembly 40 has pipes 41 formed of the same number and in the same pattern as the electrodes 2a of the semiconductor chip 2 and formed to penetrate an insulating member 42 and fixed therein, and the outer peripheral portion of the insulating member 42 is surrounded by the metal frame member 43. The metal frame member 43 is formed with the same shape and dimensions as the frame member 33 of the pin assembly 30 and the pin assembly 30 and pipe assembly 40 are positioned and fitted in the hollow portion 20a of the positioning holder 20 with the metal frame members 33 and 43 set in contact with each other in the thickness direction. At this time, the test pins 32 are inserted into the corresponding pipes 41 and projected from the upper ends thereof in the pipe assembly 40 as shown in FIG. 3 and the semiconductor chip 2 to be tested is mounted on the front end portions of the test pins 32.

The pressure lid 50 presses the electrodes 2a of the semiconductor chip 2 onto the front portions of the test pins 32 with a preset pressing force and is held on the positioning holder 20 by use of the two levers 60 at the time of testing for the semiconductor chip 2. The pressure lid 50 has a concave portion 50a formed in the undersurface thereof and corresponding in shape to the semiconductor chip 2 and four cut-away portions 50b corresponding in position to the supporting portions 21 formed on the positioning holder 20. When the pressure lid 50 is positioned and disposed on the positioning holder 20 so as to permit the supporting portions 21 to project upwardly through the four cut-away portions 50b, the rear side portion of the semiconductor chip 2 is fitted into the concave portion 5a.

The two levers 60 are used to press the pressure lid 50 and arranged to face each other in positions on both sides of the hollow portion 20a. The lever 60 is a member formed in substantially an L shape and having an operating portion 60a and a pressing portion 60b and an insertion hole 60c is formed in the width direction in a bent portion between the operating portion 60a and the pressing portion 60b. The lever 60 is rotatably mounted on the supporting portions 21, 21 by placing the lever between the adjacent supporting portions 21, 21 and inserting a pin 61 into the insertion holes 21a, 21a and the insertion hole 60c. Therefore, the pressure lid 50 is pushed downwardly by rotating the operating portion 60a of the lever 60 to press the front end face of the pressing portion 60b against the upper surface of the pressure lid 50 so that the electrodes 2a of the semiconductor chip 2 will be pressed against the front end portions of the corresponding test pins 32 with a preset pressing force. Further, the lever 60 holds the state in which the pressure lid 50 is pressed by pressing the front end face of the pressing portion 60b against the upper surface of the pressure lid 50.

The pin assembly 30 and the pipe assembly 40 constructing the socket are manufactured as follows.

FIG. 4 is a process illustrating view for illustrating a method for manufacturing the pin assembly 30 constructing the socket of this invention.

Figure 4A:
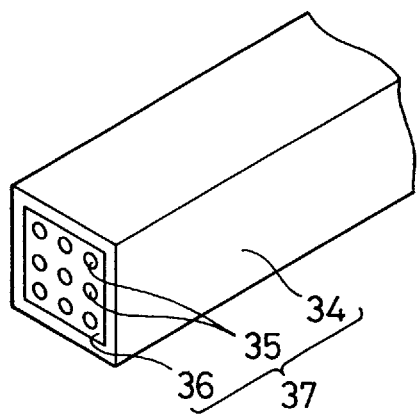
FIGS. 4A–4D is a process illustrating view for illustrating a method for manufacturing a pin assembly constructing the socket of this invention.

First, a large number of conductor wires 35 which will be used as the test pins 32 are arranged at a preset pitch in parallel to the axis of a rectangular pipe 34 with high dimensional precision which is formed of metal, for example, tool steels such as carbon tool steels or alloy tool steels in the rectangular pipe 34 and a liquid-form insulating material 36 formed of silicone rubber or high polymer elastomer is injected into the rectangular pipe 34 and solidified to form a pin composite body 37 (FIG. 4A). At this time, the arrangement pitch of the conductor wires 35 is set such that the conductor wires 35 will be formed in the same pattern as the electrodes 2a of the semiconductor chip 2 to be tested.

Figure 4B:
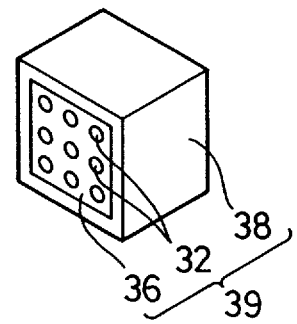

Next, the pin composite body 37 is cut to a preset thickness along a surface perpendicular to the conductor wires 35 so as to form a composite chip 39 in which the peripheral portion of the insulating material 36 is surrounded by a metal frame 38 (FIG. 4B). At this time, in the composite chip 39, the cut conductor wires 35 are used as test pins 32.

Figure 4C:
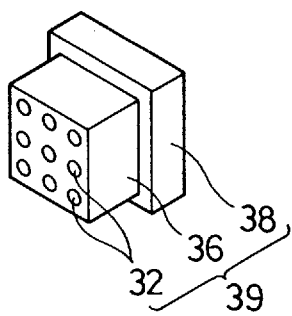

Then, the metal frame 38 on one surface side of the composite chip 39 obtained by cutting is removed by a preset length from the composite chip 39 (FIG. 4C).

Figure 4D:
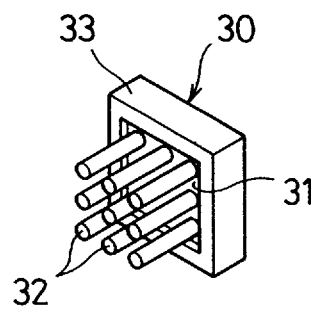

After this, the insulating material 36 is dissolved by use of solvent from both end faces of the composite chip 39 and is removed by a preset length. As a result, a pin composite body 30 having a large number of test pins 32 exposed from the insulating plate 31 by a preset length is formed (FIG. 4D).

FIG. 5 is a process illustrating view for illustrating a method for manufacturing the pipe assembly 40 constructing the socket of this invention.

Figure 5A:
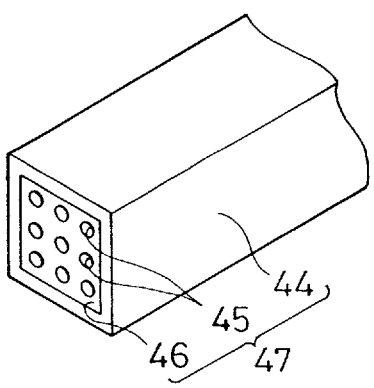
FIGS. 5A–5B is a process illustrating view for illustrating a method for manufacturing a pipe assembly constructing the socket of this invention.

In a rectangular pipe 44 of high dimensional precision having the same dimensions and the same material as the rectangular pipe 34, a large number of lengthy pipes 45 which are used as the pipes 41 are arranged at the same pitch as a large number of conductor wires 35 in parallel to the axis of the rectangular pipe 44 and a liquid-form insulating material 46 formed of silicone rubber or high polymer elastomer is injected into the rectangular pipe 44 and solidified to form a pipe composite body 47 (FIG. 5A). At this time, as the lengthy pipe 45, a pipe having an inner diameter which permits insertion of the conductor wire 35 therein is used.

Figure 5B:
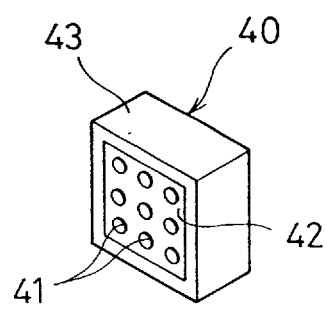

Next, the pipe composite body 47 is cut to a preset thickness along a surface perpendicular to the lengthy pipes 45. Thus, the pipe assembly 40 having a large number of pipes 41 fixed in the insulating material 42 is formed (FIG. 5B).

The socket of this invention constructed in the above-described manner is used by soldering the lower end portions of the test pins 32 to the corresponding electrodes 12a of the base plate 10 and combining the positioning holder 20 with the pipe assembly 40 as shown in FIG. 1. At this time, the test pins 32 of the pipe assembly 30 are inserted into the corresponding pipes 41 of the pipe assembly 40 in the socket and the front end portions of the test pins 32 are projected from the upper ends of the pipes 41 (FIG. 3).

At the time of testing of the semiconductor chip 2, the semiconductor chip 2 is first mounted on the pipe assembly 40 with the electrodes 2a set to face downward and the rear surface thereof set to face upward.

Next, the pressure lid 50 is mounted on the positioning holder 20 such that the concave portion 50a will be set in alignment with the semiconductor chip 2 and the supporting portions 21 may be projected upwardly from the four cut-away portions 50b.

Then, each of the levers 60 is arranged between the corresponding adjacent supporting portions 21, 21 by use of the pin 61.

After this, the pressure lid 50 is depressed downwardly by the pressing portion 60b when the operating portion 60a of each lever 60 is rotated to press the front end face of the pressing portion 60b against the upper surface of the pressure lid 50. Thus, the rear surface of the semiconductor chip 2 is uniformly depressed downwardly so that the electrodes 2a thereof will press the corresponding test pins 32.

As a result, the test pins 32 are subjected to slight elastic deformation in the corresponding pipes 41 of the pipe assembly 40, thereby causing a preset pressing force to be applied to the corresponding electrodes 2a. At this time, the front end portions of the test pins 32 will not be separated from the electrodes 2a of the semiconductor chip 2 since the front end portions of the test pins 32 are inserted into the pipes 41. Further, since the test pins 32 are held in the pipes 41 and are not largely bent, a relatively large pressing force can be obtained.

In this state, the electrical characteristic of the semiconductor chip 2 is tested by introducing the socket having the semiconductor chip 2 mounted thereon into a furnace which is set at temperatures of 70° to 100° C. and applying a voltage higher than the normal operation voltage by 10%.

After completion of the test, when the operations for taking the socket out of the furnace, setting back the levers 60 into the original position, pulling out the pins 61, and removing the pressure lid 50 from the positioning holder 20 are effected, then the test pins 32 are restored to the original shape.

Then, the semiconductor chip is replaced and the burn-in test for the semiconductor chip is effected in the same manner as described above.

EXAMPLE 1

A socket shown in FIG. 1 for testing the electrical characteristic of a silicon chip (semiconductor chip) of 10 mm×10 mm×0.5 mm on which 1600 aluminum electrodes are formed at a pitch of 0.25 mm was assembled.

The pin assembly 30 was formed by arranging 1600 Ni—Ti alloy wires of 40 μm in diameter at a pitch of 0.25 mm in parallel to the axis of a rectangular pipe formed of carbon tool steel having a length of 500 mm and an inner diameter of 10±0.01 mm in the rectangular pipe, injecting silicone rubber into the pipe and solidifying the same to form a pin composite, cutting the composite to a thickness of 6 mm, removing the rectangular pipe by 4.5 mm from one end face, and removing the silicone rubber by 5 mm from one end face and by 0.5 mm from the other end face by use of 2-methoxyethanol. The Ni—Ti alloy wires were arranged in the same pattern as the electrodes of the silicon chip.

The pipe assembly 40 was formed by arranging 1600 extremely thin pipes of cupronickel (outer diameter: 0.18 mm; inner diameter: 0.1 mm) at a pitch of 0.25 mm in parallel to the axis of a rectangular pipe which is formed of the same carbon tool steel as is used for forming the pin assembly 30 in the rectangular pipe, injecting silicone rubber into the rectangular pipe and solidifying the same to form a pipe composite, and cutting the composite to a thickness of 4 mm. The extremely thin pipes were arranged in the same pattern as the electrodes of the silicon chip.

Then, the pin assembly 30 and pipe assembly 40 were fitted into the hollow portion 20a of the positioning holder 20 of the socket and the metal frame 33 was set in contact with the metal frame 43.

At this time, the test pins 32 of the pin assembly 30 were inserted into the corresponding pipes 41 and the front end portions of the test pins 32 were projected from the pipes 41 by 0.5 mm.

Comparative Example 1

Figure 6A:
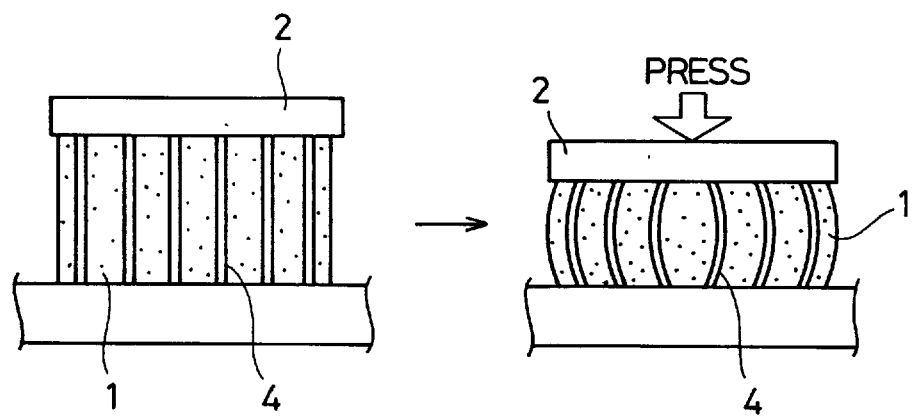
FIGS. 6A–6B is an illustration view of a conventional pin assembly.

A socket having the structure similar to that of the socket of the Example 1 except that the pipe assembly 40 was not used was formed by fitting a pin assembly of the structure shown in FIG. 6A and obtained by removing all of the carbon tool steel pipes from the composite chip (containing the test pins) with a thickness of 6 mm formed in the Example 1 into the hollow portion 20a.

Comparative Example 2

Figure 6B:
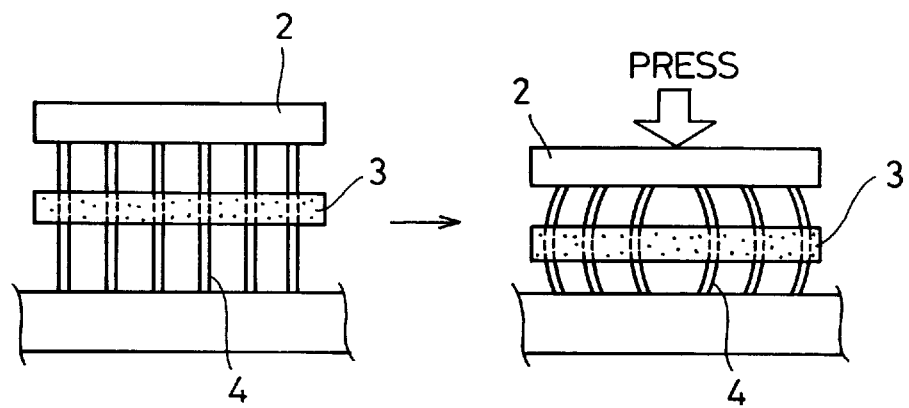

A socket having the structure similar to that of the socket of the Example 1 except that the pipe assembly 40 was not used was formed by fitting a pin assembly of the structure shown in FIG. 6B and obtained by removing all of the carbon tool steel pipes from the composite chip (containing the test pins) with a thickness of 6 mm formed in the Example 1 and removing the silicone rubber by 2 mm from both end faces into the hollow portion 20a.

Silicon chips of 10 mm×10 mm×0.5 mm each of which has 1600 aluminum electrodes arranged at a pitch of 0.25 mm were formed by use of sockets of the Example 1 and the Comparative Examples 1, 2 and 200 silicon chips for each of the Example 1 and the Comparative Examples 1, 2 were subjected to the burn-in test.

The chip was depressed by 0.4 mm and pressed against the front end faces of the test pins. Troubles (poor contact) occurring at the time of testing are shown in the table 1.

TABLE 1

| Classification | | Structure of Pin Portion | Number of Troubles | Main Cause of Troubles |
| --- | --- | --- | --- | --- |
| Invention | Example 1 | FIG. 1 | 0 | — |
| Comparison | Comparative Example 1 | FIG. 6A | 6 | front end face of pin was buried in insulator |
| | Comparative Example 2 | FIG. 6B | 19 | front end face of pin was separated from electrode |

As is clearly understood from the table 1, in the product of this invention (Example 1), no trouble occurred in the test.

On the other hand, in the Comparative Example 1, since only the front end faces of the test pins were exposed from the silicone rubber, the front ends of the test pins were buried into the silicone rubber, thereby making the electrical contact insufficient. Further, since the silicone rubber was thick, a large pressing force was required.

Further, in the Comparative Example 2, the elastic deformation of the test pins was restricted by the insulating member in the central portion of the test pins and a variation in the pressing force was large. Further, since no means for holding the exposed upper end portions of the test pins was provided, the front ends of the test pins were sometimes separated from the electrodes.

A case wherein a chip having 1600 electrodes arranged at a pitch of 0.25 mm is subjected to the burn-in test was explained above, but the same effect can be attained when this invention is applied to a chip having a larger number of electrodes arranged at a pitch of 0.16 mm.

What is claimed is:

1. A method for manufacturing a pin assembly which forms part of a bare chip testing socket, comprising the steps of:

arranging a large number of conductor wires at a present pitch in an enclosure member having an axis, in parallel to the axis of said enclosure members;

forming a pin composite body by:
   injecting an insulating material into said enclosure member, and
   solidifying said insulating material;

cutting said pin composite body with a preset thickness along a surface perpendicular to said large number of conductor wires to form a pin composite chip in which an outer peripheral portion of said insulating material is surrounded by a frame member;

removing a portion of said frame member on one end face side of said pin composite chip by a preset length from said pin composite chip; and removing said insulating material by a preset length from both end faces of said pin composite chip.

2. A method for manufacturing the pin assembly according to claim 1, wherein said step of removing said insulating material includes the step of removing said insulating material by a preset length by use of a solvent which permits a linear relation to be set up between a dissolving amount of said insulating material and an elapsed time.

3. A method for manufacturing the pin assembly according to claim 1, wherein said large number of conductor wires are arranged in a cylindrical enclosure member.

4. A method for manufacturing a pipe assembly which forms part of a bare chip testing socket, comprising the steps of:

arranging a large number of lengthy pipes which permit insertion of conductor wires therein at a preset pitch in an enclosure member having an axis, in parallel to the axis of said enclosure member;

injecting an insulating material into said enclosure member;

solidifying said insulating material to form a pipe composite body;

cutting said pipe composite body with a preset thickness along a surface perpendicular to said large number of pipes.

5. A method for manufacturing the pipe assembly according to claim 4, wherein said large number of lengthy pipes are arranged in a cylindrical enclosure member.

* * * * *